(12) United States Patent
Tsai et al.

(10) Patent No.: US 8,945,971 B2
(45) Date of Patent: Feb. 3, 2015

(54) WAFER WARPAGE REDUCTION

(71) Applicant: Taiwan Semiconductor Manufacturing Co., Ltd., Hsin-Chu (TW)

(72) Inventors: Chun Hsiung Tsai, Xinpu Township (TW); Shiang-Rung Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/936,254

(22) Filed: Jul. 8, 2013

(65) Prior Publication Data

US 2014/0264345 A1    Sep. 18, 2014

Related U.S. Application Data

(60) Provisional application No. 61/777,193, filed on Mar. 12, 2013.

(51) Int. Cl.
*H01L 21/66* (2006.01)
*H01L 29/04* (2006.01)
*H01L 21/20* (2006.01)

(52) U.S. Cl.
CPC ............ *H01L 29/04* (2013.01); *H01L 21/2022* (2013.01)
USPC .......................... 438/53; 257/52; 257/E21.53

(58) Field of Classification Search
USPC .............................. 257/52, E21.53; 438/482
See application file for complete search history.

(56) References Cited

U.S. PATENT DOCUMENTS

2013/0146132 A1*    6/2013    Kuchiyama et al. .......... 136/255

* cited by examiner

*Primary Examiner* — Jami M Valentine
(74) *Attorney, Agent, or Firm* — Eschweiler & Associates, LLC

(57) ABSTRACT

The present disclosure relates a method to mitigate wafer warpage in advanced technology manufacturing processes due to crystallization of one or more amorphous layers with asymmetrical front-surface and back-surface layer thicknesses. After deposition of one or more layers of amorphous material on a front-surface and a back-surface of the wafer in a furnace tool, the front-surface layers are patterned which thins a front layer thickness. Downstream thermal processing performed at a temperature which exceeds a crystallization threshold of the amorphous material will result in asymmetric stress between the front and back surfaces due to the asymmetrical layer thicknesses. To mitigate this effect, the amount of warpage as a function of the difference in asymmetrical layer thickness may be determined such that a front-surface deposition tool may be utilized in conjunction with the furnace tool to reduce the difference in front-surface and back-surface layer thicknesses. Other methods are also disclosed.

20 Claims, 14 Drawing Sheets

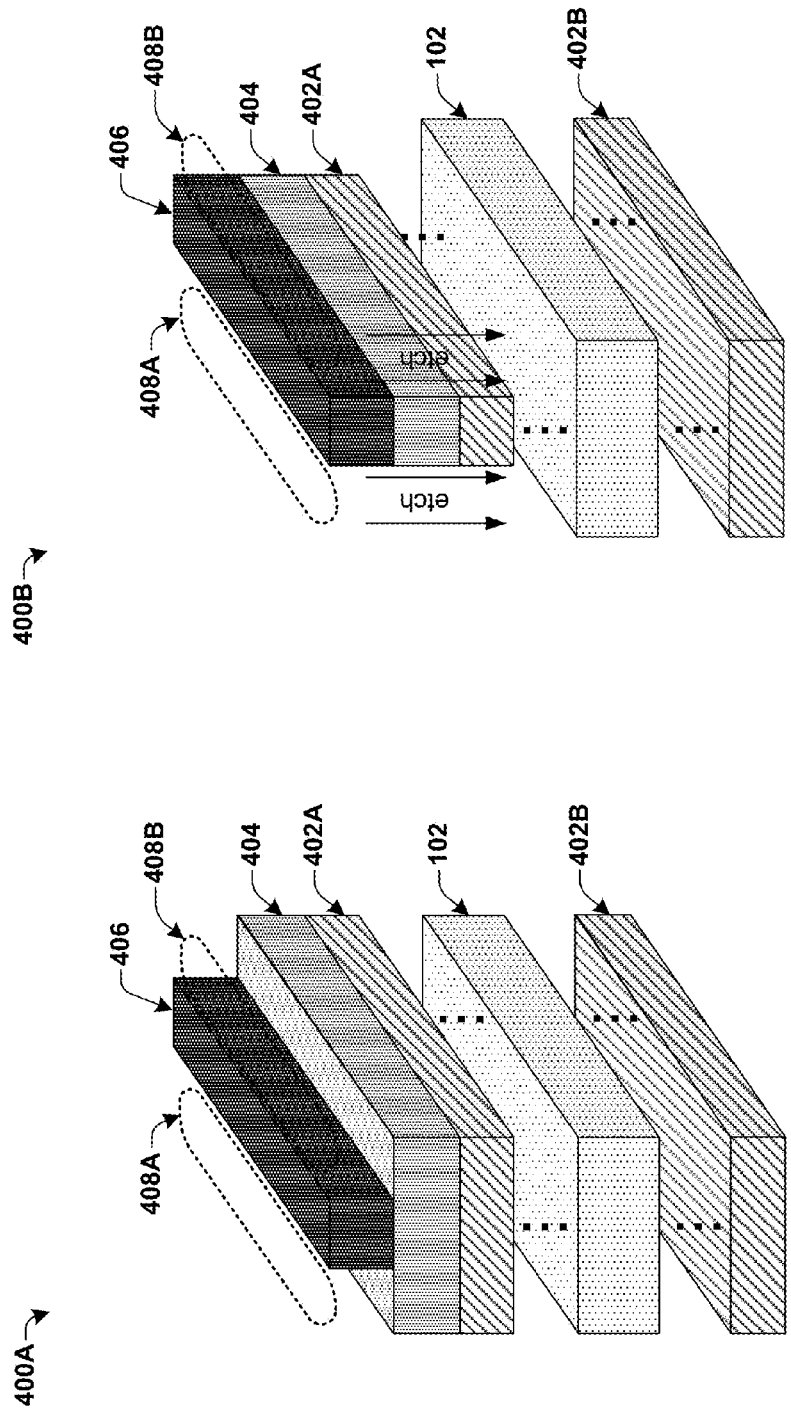

WAFER WARPAGE REDUCTION

BACKGROUND

Epitaxial growth techniques in semiconductor manufacturing are utilized to deposit a homoepitaxial or heteroepitaxial layer on a substrate, where the deposited layer matches a crystallographic configuration of the substrate. Differences in thermal properties between a substrate and the heteroepitaxial layer can degrade interface properties under thermal cycling conditions and result in damage such as a degradation of the heteroepitaxial crystal structure, substrate warpage and/or cracking, etc.

BRIEF DESCRIPTION OF THE DRAWINGS

FIGS. 4A-4K illustrate cross-sectional views of some embodiments of device structure formation through hybrid front-surface and two-sided layer deposition.

DETAILED DESCRIPTION

Figure 1:
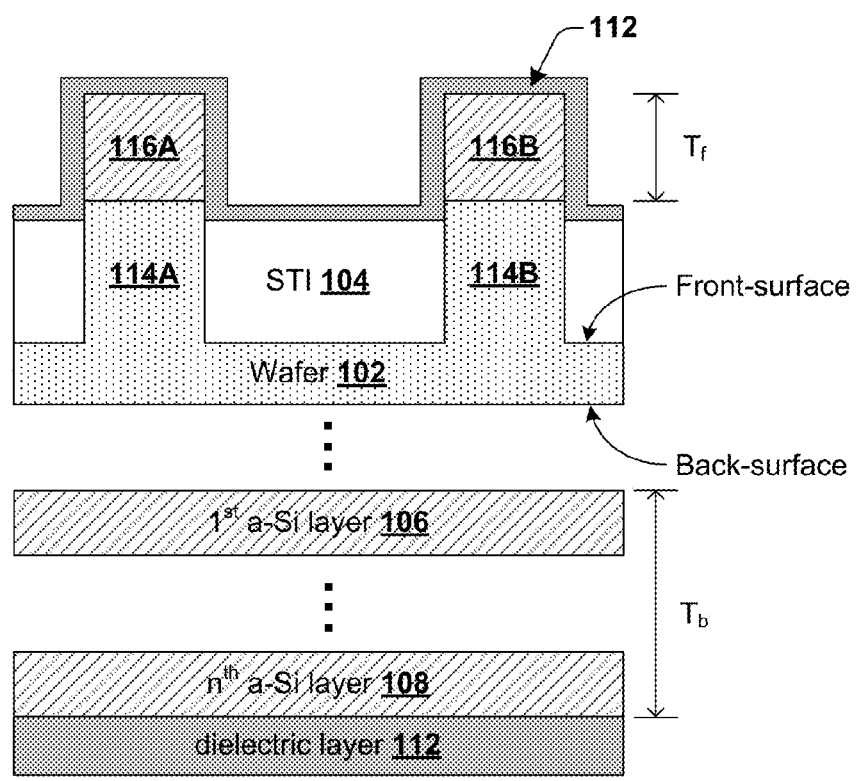
FIG. 1 illustrates some embodiments of a cross-sectional view of a device structure formed through an exemplary fabrication process.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

The present disclosure may repeat reference numerals and/or letters in the various examples. This repetition is for the purpose of simplicity and clarity and does not in itself dictate a relationship between the various embodiments and/or configurations discussed. Moreover, the formation of a first feature on a second feature in the description that follows may include embodiments in which the first and second features are formed in direct contact, and may also include embodiments in which additional features may be formed interposing the first and second features, such that the first and second features may not be in direct contact. As an example, a feature formed on a substrate may include features formed on, above, and/or within the substrate.

Advanced semiconductor manufacturing nodes such as 22 nanometer comprise memory cell dimensions of about 22 nm, and may utilize replacement metal gate (RMG) or finFET devices. In advanced semiconductor manufacturing nodes such as 22 nanometer and below, device formation is achieved through multiple deposition steps of amorphous silicon (a-Si) in a furnace tool followed a one or more thermal anneal steps including a millisecond anneal (MSA) for dopant activation. Furnace deposition results in a double-sided layer deposition, where a layer of material is disposed on both the front-surface and the back-surface of a wafer. Front-surface patterning thins the a-Si material residing on a front-surface of the wafer by a delta thickness value, resulting in an asymmetric a-Si layer thickness between a front side and a back side of the wafer. After completion of double-sided a-Si deposition and front-surface patterning, one or more thermal processes are performed at a temperature which can exceed a threshold temperature above which the a-Si material is subject crystallization into polycrystalline silicon (p-Si) or crystalline silicon (c-Si). This phase transition produces a stress between the crystallized a-Si material and the wafer which results in a strain on the surface of the wafer. Asymmetric a-Si film thicknesses between the front-surface and the back-surface of the wafer result in an unbalanced stress between the front-surface and the back-surface after the a-Si layers undergo crystallization during an anneal process which exceeds the threshold temperature of a phase transition between a-Si and p-Si or c-Si. This unbalanced stress creates wafer distortion such as warpage, which can result in breakage. In the absence of breakage, the warpage can degrade overlay control between the two or more masks.

Accordingly, the present disclosure relates a method to mitigate wafer warpage in advanced technology manufacturing processes due to crystallization of one or more amorphous layers with asymmetrical front-surface and back-surface layer thicknesses. After deposition of one or more layers of amorphous material on a front-surface and a back-surface of the wafer in a furnace tool, the front-surface layers are patterned which thins a front layer thickness. Downstream thermal processing performed at a temperature which exceeds a crystallization threshold of the amorphous material will result in asymmetric stress between the front and back surfaces due to the asymmetrical layer thicknesses. To mitigate this effect, the amount of warpage as a function of the difference in asymmetrical layer thickness may be determined such that a front-surface deposition tool may be utilized in conjunction with the furnace tool to reduce the difference in front-surface and back-surface layer thicknesses. Temperature constraints may also be utilized to prevent crystallization without constraining the difference in layer thickness.

FIG. 1 illustrates some embodiments of a cross-sectional view of a device structure 100 formed through an exemplary fabrication process, wherein multiple layers of a-Si and other layers have been deposited of a front-surface and a back-surface of a wafer 102 by furnace tool and partially removed from the front-surface, but remain on the back-surface. The multiple layers of a-Si comprise a first a-Si layer 106 through an $n^{th}$ a-Si layer 108, for a total number of n layers of a-Si. The total number (n) may vary depending upon a device fabrication process, and may include a sacrificial layer for mandrel formation in a double-patterning process, a dummy gate layer in a replacement metal gate process, a planarization layer for a chemical mechanical polish (CMP), may be utilized as a memory layer to aid in hard mask formation in the process, etc., and may be segregated from one another by one or more layers comprising dielectric layers, oxide layers, HM layers, etc.

The first a-Si layer 106 through the n$^{th}$ a-Si layer 108 each have a thickness in a range from several hundred to several thousand angstroms, and a combined back-surface thickness ($T_b$) of greater than about 3,000 angstroms with no layer removal in the exemplary embodiments of FIG. 1.

The front-surface of the wafer 102 comprises a first fin channel 114A of Si residing within a shallow trench isolation (STI) layer 104 disposed over the wafer 102, and a second fin channel 114B similarly residing within the STI layer 104. A first a-Si gate layer 116A is disposed above the first fin channel 114A, and a second a-Si gate layer 116B is similarly disposed above the second fin channel 114B. The first and second a-Si gate layers 116A, 116B are formed simultaneously with one or more of the first a-Si layer 106 through the n$^{th}$ a-Si layer 108 within the furnace tool, and partially removed from the front-surface of a wafer 102 through patterning, resulting in a total front-surface thickness ($T_f$) of a-Si of less than about 1,000 angstroms. A dielectric layer 112 such as silicon nitride (SiN) is then formed simultaneously on the front-surface and the back-surface of the wafer 102 by the furnace tool, and is configured to provide isolation of the device structure 100.

For the embodiments of FIG. 1, a-Si material deposition by the furnace tool utilizes a maximum temperature of less than about 530° C. After formation of the first and second a-Si gate layers 116A, 116B, dopants are disposed in source and drain regions of the device structure 100. For the embodiments of FIG. 1, an ion implantation process may be used to form lightly doped drain (LDD) regions. LDDs are configured to minimize hot-carrier effects and control drain-substrate breakdown by reducing a doping gradient between the source or drain and a channel region which lowers electric field in the channel region in the vicinity of the source or drain regions of the device. For an n-type device, the dopants may include phosphorus (P), or arsenic (As), or combinations thereof. For a p-type device, the dopants may include boron (B), $BF_2$, or combinations thereof. Other dopants may also be used.

In some embodiments comprising a Metal Oxide Semiconductor Field Effect Transistor (MOSFET) device, an epitaxial layer containing a dopant may be disposed by chemical vapor deposition (CVD), and/or other suitable formation process. For an NMOS the epitaxial layer may contain silicon phosphorus (SiP) or silicon carbon phosphorus (SiCP). For a PMOS the epitaxial layer may contain germanium-boron (GeB) or boron-doped silicon germanium (SiGeB). In some embodiments, the epitaxial layer may produce a stress on the channel region due to a lattice mismatch between the epitaxial layer and the wafer 102, which can increase channel carrier mobility for the device.

After the dopants are delivered to the device structure 100, a thermal anneal is performed to drive in and to activate the dopants, in accordance with some embodiments. The thermal anneal may utilize a rapid thermal anneal (RTA), spike anneal, millisecond anneal (MSA), or laser anneal. A spike anneal operates at peak anneal temperature in the order of second. A MSA operates at peak anneal temperature in the order of milliseconds. A laser anneal operates at peak anneal temperature in the order of micro seconds. For the embodiments of device structure 100, an MSA is used with a thermal budget comprising a pre-heat temperature in a range from about 700° C. to about 800° C. for an option duration in range from about 2 seconds to about 10 seconds, and a peak heating temperature in a range from about 1,100° C. to about 1,200° C. for a duration in a range from about 0.8 ms to about 12 ms. For some embodiments of an RTA, a thermal budget including a peak temperature in a range between about 900° C. and about 1,000° C. for a duration of greater than about 1.5 seconds is required for dopant activation. An MSA can replace the RTA because of its capability for a higher temperature (i.e., greater than 1,000° C.). Consequently, the duration of the thermal budget may be decreased when going from an RTA to an MSA (i.e., the range between about 0.8 ms and 12 about ms), which achieves dopant activation with the less dopant diffusion than an RTA.

For some embodiments of the MSA anneal, the duration of the thermal budget is constrained to be less than about 12 ms due to anneal tool capability. While the duration of the peak heating temperature contributes to warpage, the duration of the a pre-heat temperature is approximately three orders of magnitude larger than the duration of the peak heating temperature, and therefore makes a more significant contribution.

Upon completion of the a-Si layer deposition, the dielectric layer 112 configured to isolate the device structure 100 is disposed on the front-surface and back-surface of the wafer 102. Prior to the MSA process, warpage of the wafer 102 is measured to be about 25 µm. However, subsequent to the MSA process, the warpage increases to greater than about 100 µm due to crystallization of the a-Si into p-Si or c-Si during the MSA process, resulting an unbalanced stress from the asymmetric a-Si layer thickness between the front-surface and the back-surface.

Figure 2A:
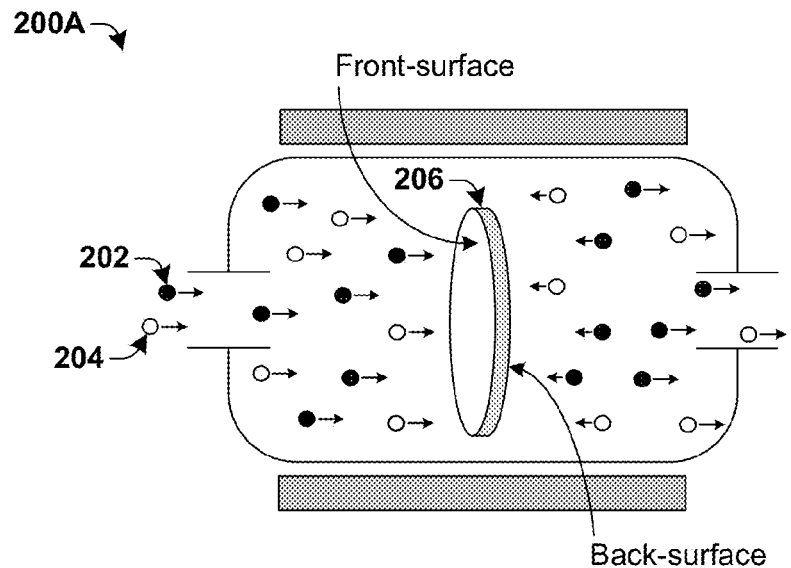
FIGS. 2A-2B illustrate some embodiments of layer deposition on a workpiece.

In some embodiments, to determine the amount of warpage as a function of asymmetric layer thickness a design of experiment (DOE) may be employed, where a delta threshold is determined which defines a critical difference between $T_f$ and $T_b$ that results in wafer warpage above a predetermined threshold under a fixed thermal budget. One or more layers of a-Si are deposited with a furnace tool 200A as depicted in FIG. 2A, wherein a silicon-containing material 202 is carried by one or more source vapors 204 and deposited on a front-surface and a back-surface of a substrate 206. After removal from the furnace tool 200A, lithographic patterning steps are performed on the one or more layers of a-Si on the front-surface which thins a total front-surface thickness on the substrate 206. The substrate 206 is then subjected to an anneal step which heats the substrate 206 with a temperature which exceeds a crystallization threshold of the a-Si material (i.e., greater than 600° C.), and an amount of substrate warpage is determined as a function of a difference between $T_f$ and $T_b$, or thickness delta. It is also determined that in an absence of heating the substrate that a warpage value of the substrate 206 remains less than about 30 µm, even upon removal of all a-Si material from the back-surface. Similarly, upon heating with the temperature greater than 600° C. a warpage of greater than about 100 µm is observed. However, this warpage reduces to less than about 30 µm upon removal of all a-Si material from the back-surface. Therefore, strain-induced warpage on the back-surface as a result of the thickness delta, and a delta threshold value comprising a maximum acceptable thickness delta may be established for an amorphous material under a fixed thermal budget.

Temperature constraints may also be introduced as a means to avoid significant wafer warpage. To achieve this, a temperature of all downstream fabrication steps subsequent to a-Si material deposition and front-surface patterning may be constrained to not exceed a crystallization threshold of the a-Si material (i.e., less than about 600° C.). In some embodiments comprising a device heterostructure of amorphous material deposited on a substrate, the temperature for subsequent processing steps is determined though a DOE comprising determining an amount of substrate warpage as a function of a variable temperature for a fixed the delta in thickness between the total front-side amorphous material thickness and total back-side amorphous material thickness. The DOE comprises depositing one or more layers of amorphous material on the front-surface and the back-surface of a substrate with the furnace tool. Lithographic patterning steps are then performed on the one or more layers which thins a total front-surface thickness but leaves a total back-surface thickness unchanged, resulting in the thickness delta. The substrate is then heated with a variable temperature to determine the amount of substrate warpage as a function of temperature such that a maximum temperature for downstream fabrication steps subsequent to a-Si layer deposition may be established for a fixed thickness delta.

Figure 3A:
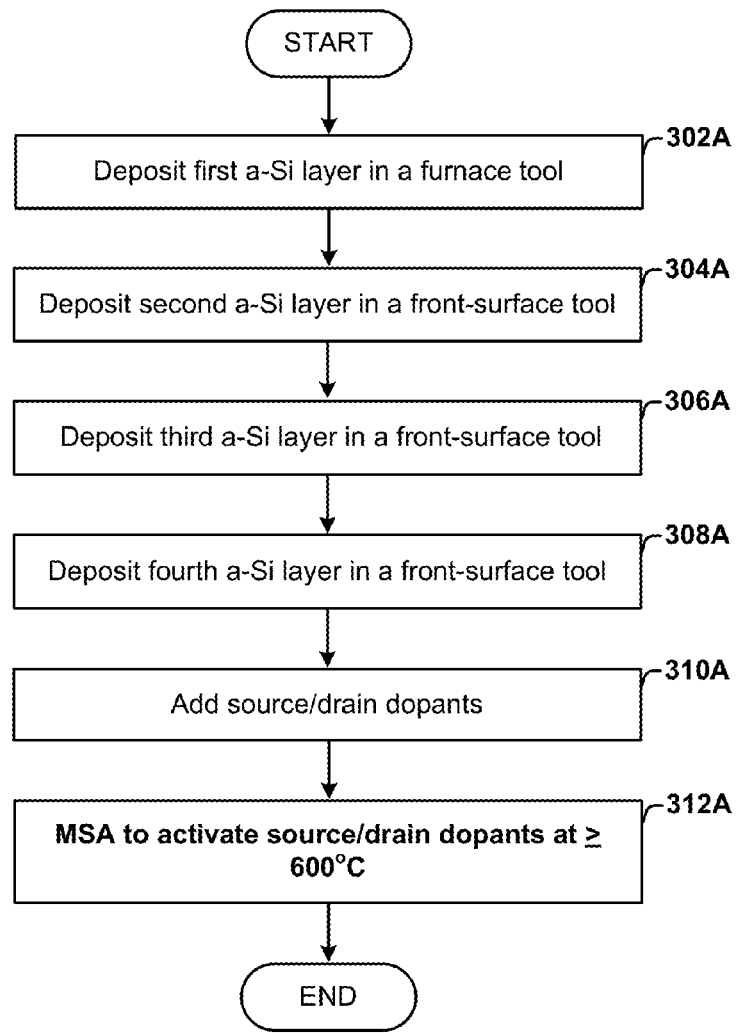
FIGS. 3A-3B illustrate some embodiments of methods of front-surface and two-sided layer deposition on a workpiece, wherein the methods anticipate and avoid wafer warpage above a predetermined threshold.
Figure 3B:
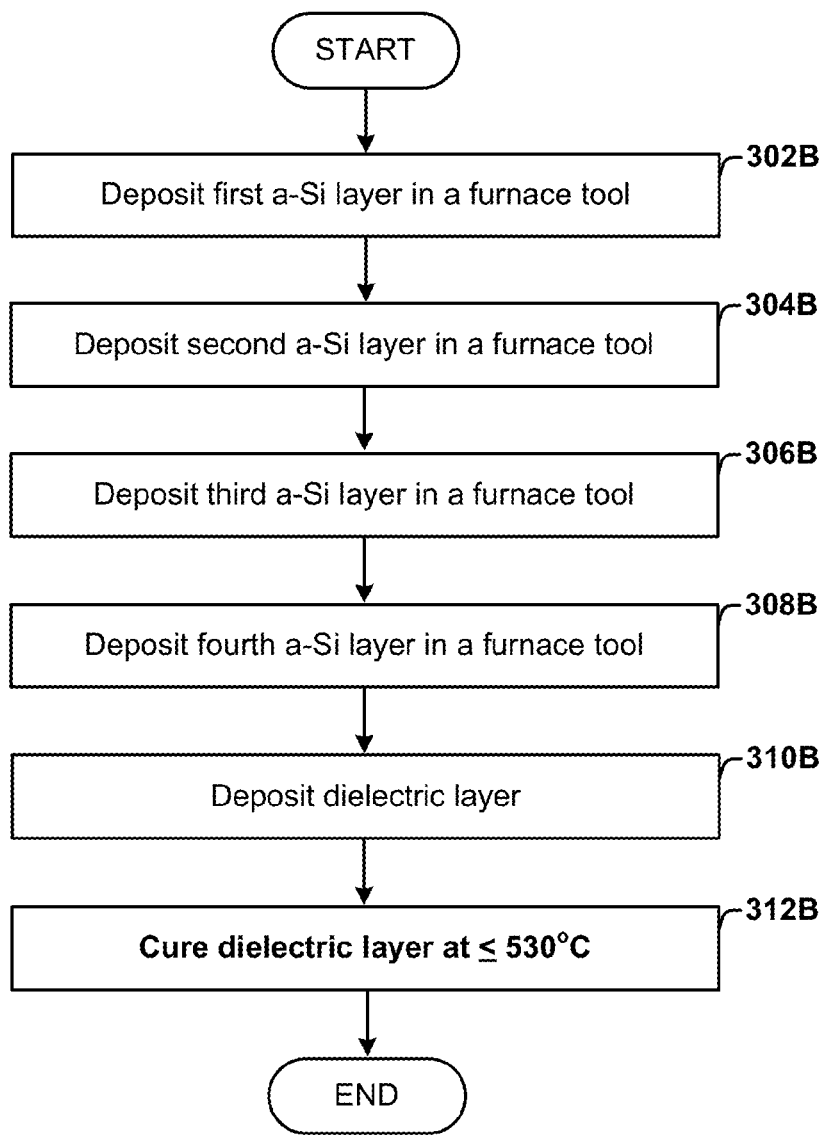

FIGS. 3A-3B illustrate some embodiments of methods 300A and 300B of front-surface layer deposition and two-sided layer deposition, respectively, on a workpiece, wherein the methods anticipate and avoid wafer warpage above a predetermined threshold. While methods 300A and 300B, and subsequent methods 700 and 800 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 3A illustrates some embodiments of a method 300A of hybrid front-surface and two-sided layer deposition on a workpiece which anticipates and avoids wafer warpage above a predetermined delta threshold value between amorphous front-surface layer thickness and amorphous back-surface layer thickness.

At 302A the workpiece subject to a patterning step comprising formation of one or more channel fins within the workpiece. In some embodiments, the workpiece comprises a substrate of a material, whereupon a first layer of the a-Si is deposited in a furnace tool. For the embodiments of FIG. 3A, the workpiece is a semiconductor substrate comprising silicon. Alternatively, the workpiece may comprise an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Multiple mask align, exposure, and layer removal steps are performed to define device features formed on various layers (e.g., gates, metallization features, etc.) on the workpiece. In some embodiments, the first layer of the a-Si is utilized in the formation of a memory layer or hard mask (HM) layer configured to retain pattern information between exposure steps. The patterning step results in essentially the complete removal of the first layer of the a-Si from the front-surface of the workpiece.

Figure 2B:
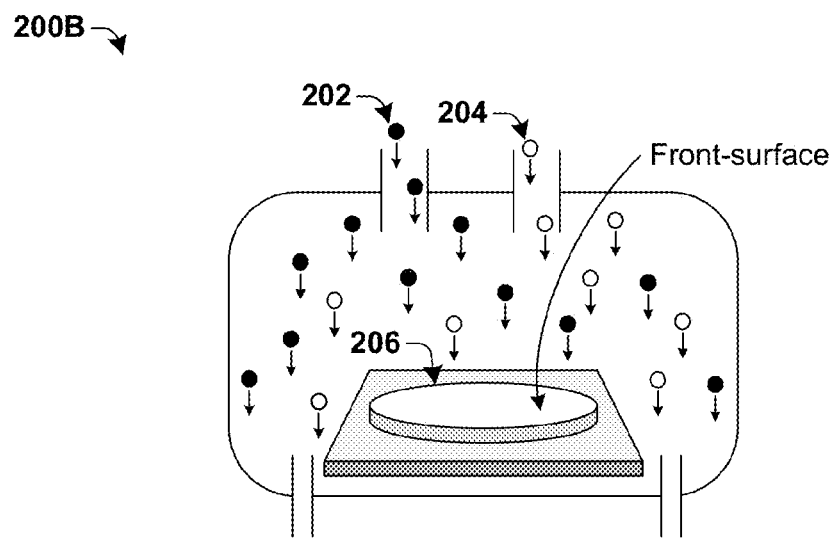

At 304A, after the workpiece is transferred from the furnace tool to a front-surface tool configured to deposit a (silicon-containing) material 202 which carried by one or more source vapors 204 on a front-surface only a substrate 206, as depicted in the embodiments of FIG. 2B, a gate material comprising a second layer of a-Si or p-Si is deposited. In some embodiments, the deposited material comprises a-Si for increased throughput over the deposition of p-Si. In some embodiments, the second layer of a-Si or p-Si comprises a dummy gate (DG) configured as a placeholder which will be removed to form a recess and replaced by a metal layer in a replacement metal gate (RMG) process. Although thinned, the second layer remains disposed on the front-surface of the workpiece after patterning.

At 306A a third layer of a-Si or p-Si is deposited by a front-surface tool. In some embodiments, the third layer of a-Si or p-Si is deposited for CMP planarization of the gate material.

At 308A a fourth layer of a-Si or p-Si is deposited by a front-surface tool. In some embodiments, the fourth layer of a-Si or p-Si is configured as an HM layer to receive a gate pattern for gate formation in a subsequent etch step.

For the embodiments of method 300A, four layers of a-Si or p-Si are utilized. In general the number of layers can be arbitrary for a patterning process which utilizes a furnace tool and removes a substantial portion of the one or more of the front-surface layers while leaving the back surface layers unaffected, and subsequently utilizes a thermal process which exceeds a crystallization threshold of Si. Furthermore, more than one front-surface tool may be utilized for actions 304A-308A.

At 310A, upon completion of the subsequent fabrication steps to define a device on the front-surface of the workpiece, wherein the a-Si or p-Si material residing on the front-surface of the workpiece has been thinned by essentially completely removing the first layer, the third layer, and the fourth layer of a-Si or p-Si material, source/drain dopants are added.

At 312A a junction formation anneal is performed to activate the dopants, and comprises an MSA with a temperature of greater than about 600° C. Although this temperature exceeds the crystallization threshold of a-Si, the thickness delta between the first layer of a-Si material residing on the back-surface and the thinned remnants of the a-Si or p-Si material residing on the front-surface is less than the delta threshold value which causes significant workpiece warpage.

FIG. 3B illustrates some embodiments of a method 300B of two-sided layer deposition on a workpiece within a furnace tool which anticipates and avoids wafer warpage by constraining fabrication processes subsequent to a-Si layer deposition and front-surface thinning to a temperature which does not exceed a crystallization threshold of the a-Si material. Method 300B comprises actions 302B-308B which are identical to actions 302A-308A, respectively, of method 300A, with an exception that actions 302B-308B deposit a-Si only, and all occur within one or more furnace tools.

At 310B, upon completion of the subsequent fabrication steps to define a device on the front-surface of the workpiece, wherein the a-Si material residing on the front-surface of the workpiece has been thinned by essentially completely removing the first layer, the third layer, and the fourth layer of a-Si or p-Si material, a passivation step is performed comprising deposition of a dielectric layer (e.g., SiN)

At 312B, a cure step is performed which comprises a thermal budget of less than about 530° C. for greater than about 30 minutes. Although the thickness delta between the first layer of a-Si material residing on the back-surface and the thinned remnants of the a-Si material residing on the front-surface is greater than the delta threshold value which causes significant workpiece warpage, the thermal budget includes a temperature which does not exceed the crystallization threshold of a-Si.

For the embodiments of methods 300A and 300B, four layers of a-Si or p-Si are utilized. In general the number of layers can be arbitrary for a patterning process which utilizes a furnace tool and removes a substantial portion of the one or more of the front-surface layers while leaving the back surface layers unaffected, and subsequently utilizes a thermal process which exceeds a crystallization threshold of Si.

For the embodiments of FIG. 3A the thermal process comprises an MSA for dopant activation. In general, when a workpiece is subjected to deposition and patterning of one or more layers of an amorphous material which results in removal of a significant portion of a subset of the one or more layers, followed by a downstream thermal process which exceeds a crystallization threshold of the material, a thickness delta between a total front-surface thickness of the material and a total back-surface thickness of the material can be monitored and kept below a delta threshold value which results in significant asymmetric stress on the workpiece by utilization of a front-surface tool to deposit all of, or the subset of layers.

For the embodiments of FIG. 3B the thermal process comprises an cure step for a dielectric layer. In general, when a workpiece is subjected to deposition of one or more layers of an amorphous material of its front and back surfaces, and subjected to front-surface patterning which reduces the total front-surface thickness, the thickness delta can by increased ignored without significant workpiece warpage if a temperature of any downstream thermal process is constrained to be less than the recrystallization threshold of the amorphous material.

FIGS. 4A-4K illustrate cross-sectional views of some embodiments of device structure formation through hybrid front-surface and two-sided layer deposition.

Figure 4D:
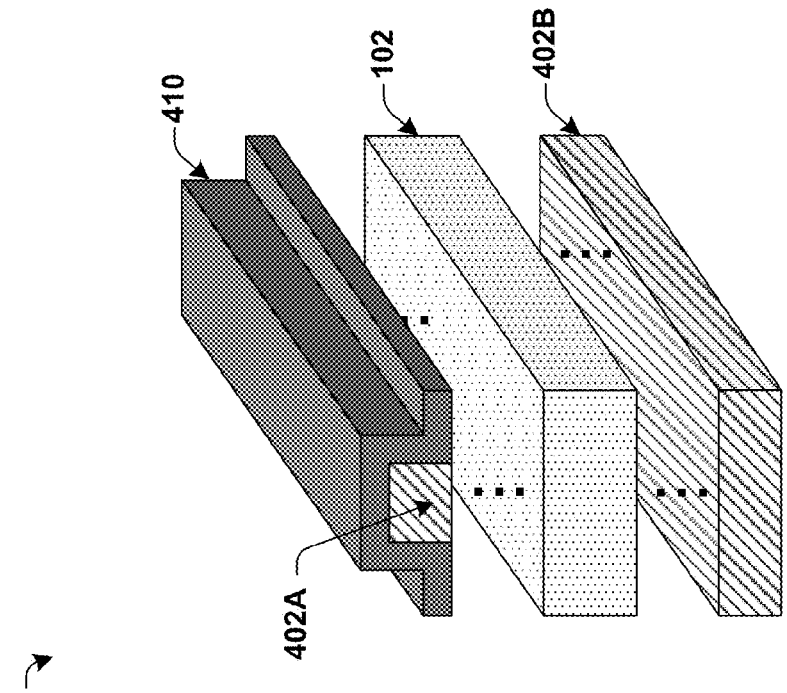

FIG. 4A illustrates a cross-sectional view of a device heterostructure 400A comprising a wafer 102, wherein one or more front-surface and back-surface intermediate layers are deposited within the furnace tool to form the device heterostructure 400A. In some embodiments, the furnace tool comprises a chemical vapor deposition (CVD) tool, a physical vapor deposition (PVD) tool, a thermal oxidation tool, etc. The furnace tool offers an advantage of throughput, as several wafers may be processed in parallel. In some embodiments, the one or more front-surface and back-surface intermediate layers include oxidation layers, dielectric layers, liners, etc., and may be deposited before, after, or in between amorphous material layer formation in the embodiments of FIGS. 4A-4K.

A first front-surface amorphous material layer 402A and a first back-surface amorphous material layer 402B are deposited above front-surface and back-surface one of more of the intermediate layers. In some embodiments, the first front-surface amorphous material layer 402A comprises a-Si and is utilized in the formation for one or more fin structures within the wafer 102, and further comprises a first thickness of less than about 1,000 angstroms in accordance with a delta threshold value determined by the aforementioned DOE methods.

Upon transferring the device heterostructure 400A from the furnace tool to a front-surface deposition tool, a stack of one or more HM layers 404 utilized as a source or drain definition layer in fin channel formation on the wafer 102 are disposed over the first front-surface amorphous material layer 402A. In some embodiments, the front-surface deposition tool comprises a CVD tool, a PVD tool, or electrodeposition or other epitaxial tool such as a sputtering tool, a vapor phase epitaxy (VPE) tool, etc. In some embodiments, the one or more HM layers 404 may comprise an advanced pattern film (APF), a SiON layer, a bottom antireflective coating (BARC) layer, or a combination thereof. A layer of photoresist 408 is then spin-coated over the one or more HM layers 404 and patterned using a DP technique create a first opening 408A and a second opening 408B in the layer of photoresist 406.

Figure 4C:
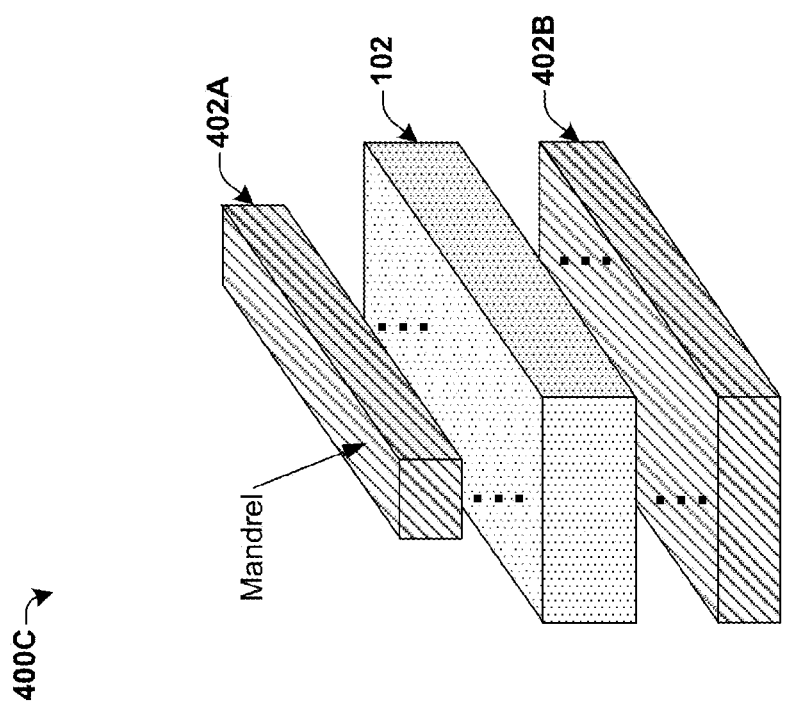

FIG. 4B illustrates a cross-sectional view of a device heterostructure 400B comprising device heterostructure 400A, wherein the first opening 408A and the second opening 408B on the front-surface of the wafer 102 have been etched through the first front-surface amorphous material layer 402A. It will be appreciated by one of ordinary skill in the art of lithography that numerous etch methods may be utilized, such as a wet etch, a dry etch, a reactive ion etch, etc., with or without etch selectivity. FIG. 4C illustrates a cross-sectional view of a device heterostructure 400C comprising device heterostructure 400B, wherein the layer of photoresist 406 and the one or more HM layers 404 have been removed after etch. In some embodiments, the remaining first front-surface amorphous material layer 402A acts as a mandrel for patterning in fin channel formation.

FIG. 4D illustrates a cross-sectional view of a device heterostructure 400D comprising device heterostructure 400C, wherein a fin definition layer 410 (e.g., SiN) has been deposited over the first front-surface amorphous material layer 402A (mandrel) in the front-surface deposition tool.

Figure 4F:
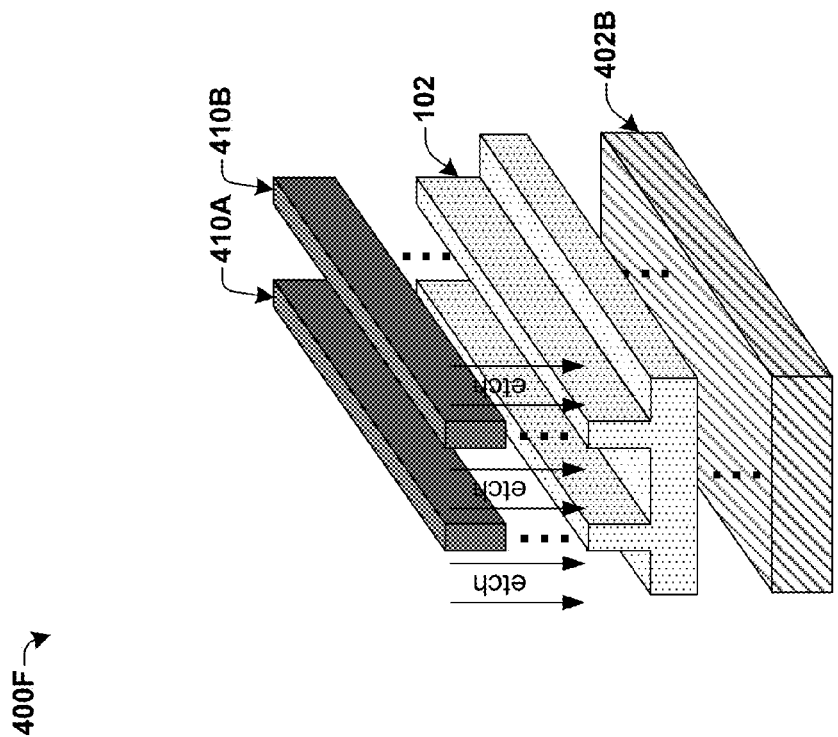
Figure 4E:
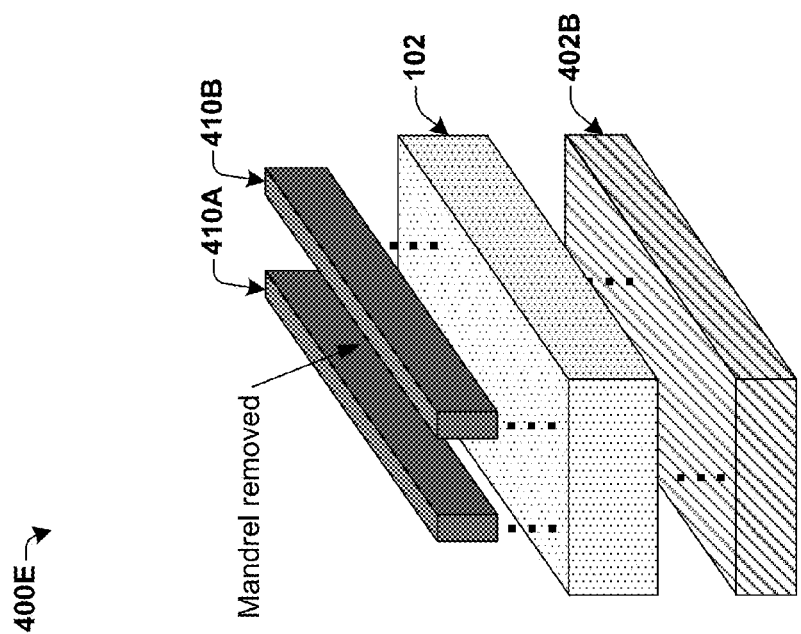

FIG. 4E illustrates a cross-sectional view of a device heterostructure 400E comprising device heterostructure 400D, wherein a thickness of the fin definition layer 410 has been uniformly reduced by an etch or other uniform removal technique, and the remaining mandrel of the first front-surface amorphous material layer 402A has also been removed, leaving a first fin HM shape 410A and a second fin HM shape 410B.

Figure 4H:
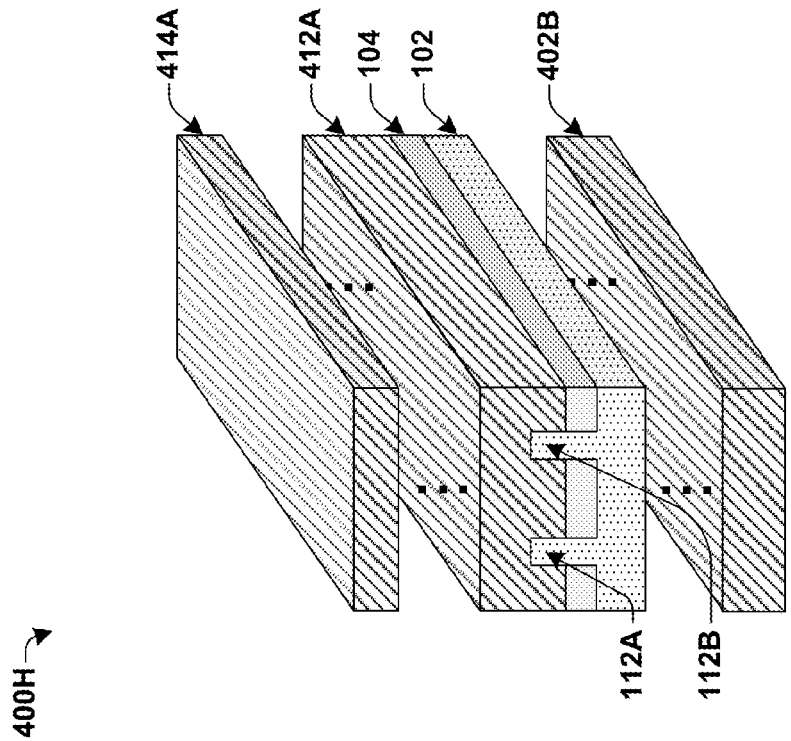
Figure 4G:
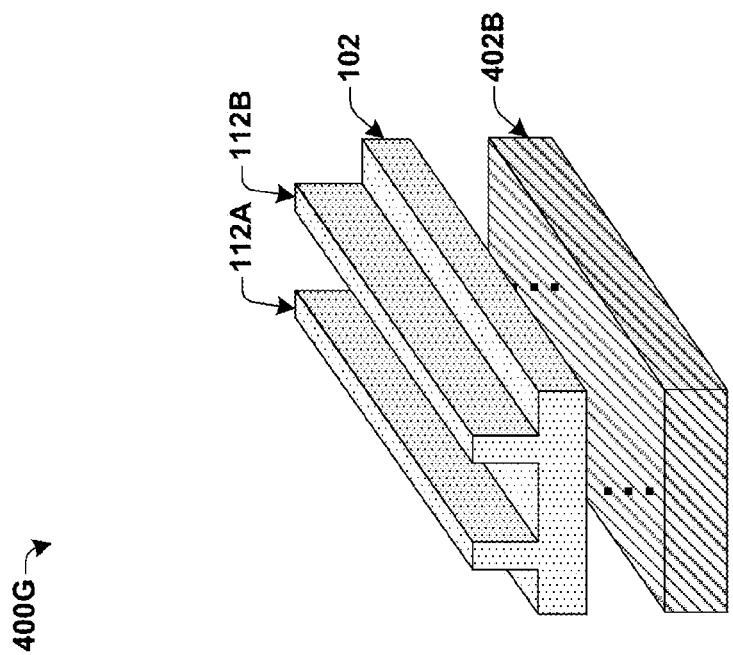

FIG. 4F illustrates a cross-sectional view of a device heterostructure 400F comprising device heterostructure 400E, wherein regions of the front-surface not blocked by the first and second fin HM shapes 410A, 410B are etched partially through the wafer 102, whereupon removal of the etched layers above the wafer 102 results in a device heterostructure 400G of FIG. 4G, wherein the wafer 102 front-surface now comprises a first fin channel 114A and a second fin channel 114B.

FIG. 4H illustrates a cross-sectional view of a device heterostructure 400H comprising device heterostructure 400G, wherein additional front-surface amorphous material layers have been deposited in the front-surface tool. The additional front-surface layers comprise a second front-surface amorphous material layer 412A and a third front-surface amorphous material layer 414A. In some embodiments, the second front-surface amorphous material layer 412A comprises a-Si and is utilized to form a dummy gate layer comprising a second thickness in a range from about 1,000 angstroms to about 2,000 angstroms disposed above a shallow trench isolation (STI) layer 104. In some embodiments, the third front-surface amorphous material layer 414A comprises a planarization layer further comprising a third thickness of in a range from about 600 angstroms to about 700 angstroms.

Figure 4J:
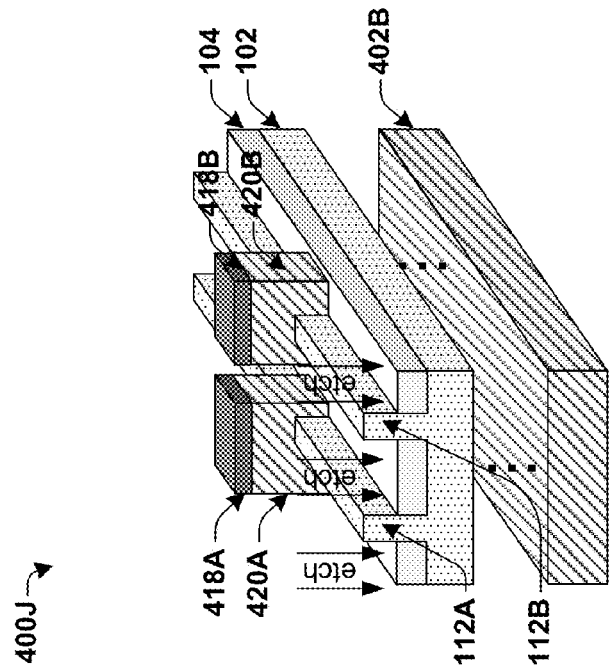
Figure 4I:
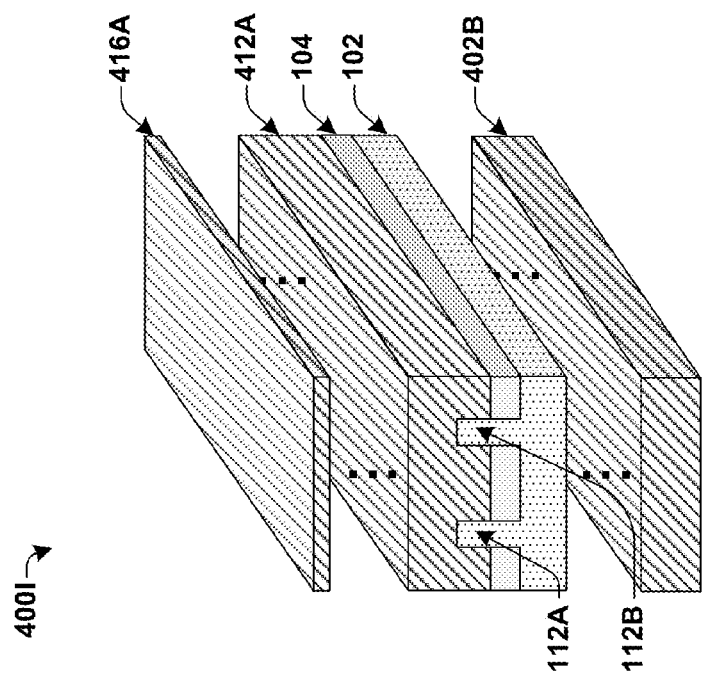

FIG. 4I illustrates a cross-sectional view of a device heterostructure 400I comprising device heterostructure 400H, wherein the third front-surface amorphous material layer 414A has been removed through a CMP process and a fourth front-surface amorphous material layer 416A has been disposed. In some embodiments, the fourth front-surface amorphous material layer 416A comprises a fourth thickness in a range from about 200 angstroms to about 400 angstroms, and is utilized for subsequent fabrication steps comprising the formation of gate structures on the device heterostructure 400I.

FIG. 4J illustrates a cross-sectional view of a device heterostructure 400J comprising device heterostructure 400I, wherein the fourth front-surface amorphous material layer 416A has been patterned and transferred to an intermediate HM layer to define first and second gate HM shapes 418A, 418B, which in some embodiments comprise SiN and are utilized to form first and second gate structures 420A, 420B, respectively. Formation of the first and second gate structures 420A, 420B may comprise transfer of the pattern formed in the first and second gate HM shapes 418A, 418B by an etch through the second front-surface amorphous material layer 412A to expose the first fin channel 114A and the second fin channel 114B as well as a top surface of the STI layer 104, and where only patterned portions of the second front-surface amorphous material layer 412A and the first and second gate HM shapes 418A, 418B remain. Note that the first and second gate structures 420A, 420B are formed by the patterned portions of the second front-surface amorphous material layer 412A. In some embodiments, the first and second gate structures 420A, 420B comprises a dummy gates (DGs) configured as a placeholder which will be removed to form a recess and replaced by a metal layer in a replacement metal gate (RMG) process.

Figure 4K:
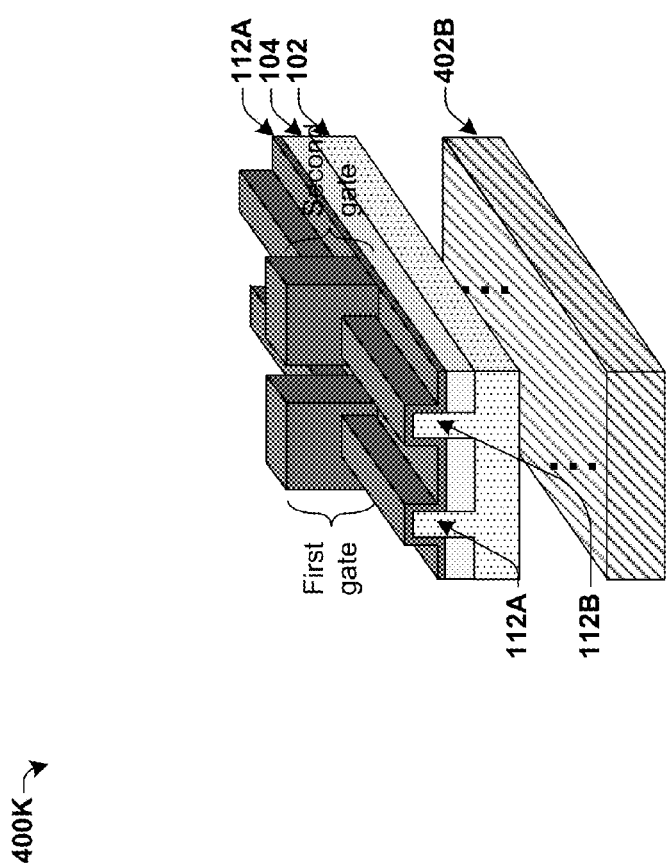

FIG. 4K illustrates a cross-sectional view of a device heterostructure 400K comprising device heterostructure 400J, where a top dielectric layer 112A, which in some embodiments comprises SiN, is disposed above the front-surface of device heterostructure 400J and configured to isolate the front-surface device, thereafter an MSA step is performed to cure the top dielectric layer 112A, the MSA step comprising a temperature of greater than about 600° C., which causes crystallization of any remaining portions of the first front-surface amorphous material layer 404A, the second front-surface amorphous material layer 412A, the third front-surface amorphous material layer 414A, and the fourth front-surface amorphous material layer 416A. However, as a thickness delta between these layers on a front-surface and back surface of the wafer 102 is less than the delta threshold value of about 1,000 angstroms for a-Si under the fixed thermal budget, significant wafer warpage (i.e., greater than about 30 μm) does not occur.

Figure 5:
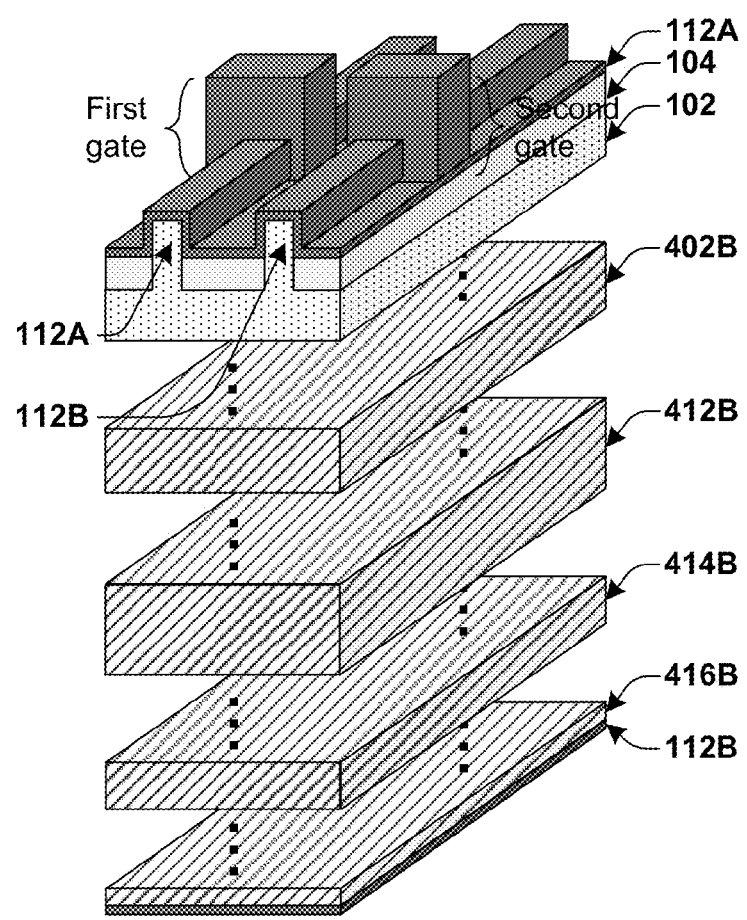
FIG. 5 illustrates a cross-sectional view of some embodiments of a device structure formed through two-sided layer deposition under temperature constraints.

FIG. 5 illustrates a cross-sectional view of some embodiments of a device structure 500 formed through two-sided layer deposition under temperature constraints. The device structure 500 of the embodiments of FIG. 5 is formed by a method which includes the same actions as shown in the embodiments of FIGS. 4A-4K, which are formed through hybrid front-surface and two-sided layer deposition. In contrast, all layers of device structure 500 are formed in a two-sided furnace tool. As a result, a back surface of the wafer 102 contains the additional layers formed in a front-sided tool in the embodiments of FIGS. 4A-4K. Namely, the additional layers include: a second back-surface amorphous material layer 412B formed simultaneously with the second front-surface amorphous material layer 412A and comprising the second thickness in a range from about 1,000 angstroms to about 2,000 angstroms, a third back-surface amorphous material layer 414B formed simultaneously with the third front-surface amorphous material layer 414A and comprising the third thickness in a range from about 600 angstroms to about 700 angstroms, and a fourth back-surface amorphous material layer 416B formed simultaneously with the fourth front-surface amorphous material layer 416A and comprising the fourth thickness in a range from about 200 angstroms to about 400 angstroms. A bottom dielectric layer 112B corresponds to the top dielectric layer 112A, and is formed simultaneously with the top dielectric layer 112A in the furnace tool.

For the embodiments of FIG. 5, the front-surface and back-surface amorphous material layers comprise a-Si with a thickness delta that is greater than the delta threshold value of about 1,000 angstroms for a-Si. However, all downstream thermal processes (e.g., anneal, layer deposition, cure, etc.) are performed with a temperature of less than about 600° C., which avoids crystallization of the amorphous material layers and hence stress induced warpage.

While the front-surface device shown in the embodiments of FIG. 5 is a finFET transistor, in other embodiments the front-surface device may include a metal-oxide-semiconductor field effect transistor (MOSFET), complementary MOS (CMOS) transistor, bipolar junction transistor (BJT), finFET transistor, a high power MOS transistor such as an ultra-high voltage (UHV) device, or an device manufacturing process utilizing multiple deposition and removal steps of an amorphous material. Also, the front-surface device may be included in an integrated circuit (IC) such as a microprocessor, memory device, or other IC in combination with one or more of the aforementioned devices. The IC may also include various passive and active microelectronic devices, such as resistors, capacitors, inductors, diodes, etc.

Figure 6:
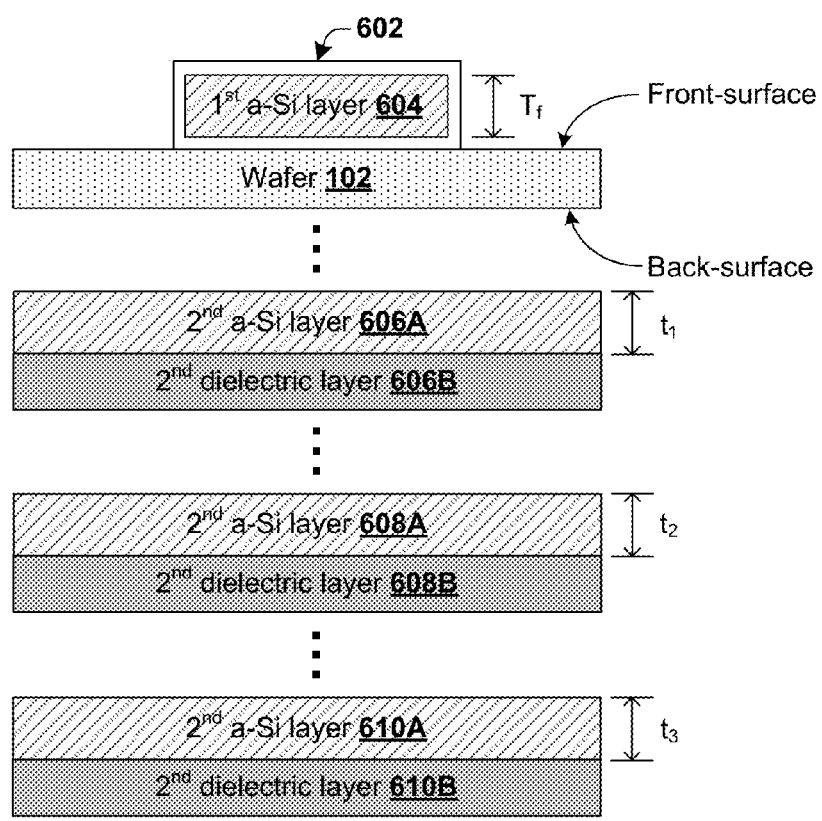
FIG. 6 illustrates some embodiments of a cross-sectional view of a device structure formed through an exemplary fabrication process comprising multiple intermediate dielectric layers.

FIG. 6 illustrates some embodiments of a cross-sectional view of a device structure 600 including a device 602 disposed on a front-surface of a wafer 102 and comprising one or more first layers 604 of a-Si. The device structure 600 further comprises one or more second layers 606A, 608A, 610A of a-Si disposed on a back-surface of the wafer 102 and separated from one another by one or more dielectric layers 606B, 608B, 610B. In some embodiments the one or more first layers 604 and the one or more second layers 606A, 608A, 610A comprise a material other than Si, but do comprise the same material resulting from a fabrication process wherein the one or more first layers 604 are formed simultaneously with a portion of the one or more second layers 606A, 608A, 610A.

The one or more dielectric layers 606B, 608B, 610B comprise a high-melting-point solid and are relatively chemically inert, and thus may be utilized as HM layer for a patterning process, or a final dielectric layer. In some embodiments, the final dielectric layer 610B comprises SiN configured to electrically isolate and protect the device structure 600 against contaminants such as water or sodium. The SiN deposition process may be followed by a cure step which is performed at a temperature greater than about 600° C., thus exceeding a crystallization threshold wherein a phase transition from an a-Si to a c-Si or p-Si phase occurs.

For manufacturing processes wherein thermal processes subsequent to the formation of the one or more first or second layers 604, 606A, 608A, 610A occur at a temperature which exceeds the crystallization threshold of a-Si, the one or more first or second layers 604, 606A, 608A, 610A comprise a crystalline of poly-crystalline phase of the material and result in stress on the wafer 102. Patterning steps performed subsequent to the formation of the one or more first or second layers 604, 606A, 608A, 610A thin a total front-surface layer thickness ($T_f$) to a value which is less than the total thickness is the total back-surface layer thickness ($T_b = t_1 + t_2 + t_3$). To minimize warpage below a predetermined warpage threshold (e.g., to a warpage of less than 100 μm) for downstream processes which exceed the crystallization threshold of a-Si, a difference between the total back-surface layer thickness ($T_b$) and the total front-surface layer thickness ($T_f$) should be less than the delta threshold value ($\delta T$):

$$T_b - T_f < \delta T.$$

Therefore, $T_f > T_b - \delta T$, or the total front-surface layer thickness ($T_f$) has a value which is greater than a difference between the total layer thickness ($T_b$) and the delta threshold value ($\delta T$).

For processes wherein downstream thermal processes occur at a temperature which does not exceed the crystallization threshold, the one or more first or second layers 604, 606A, 608A, 610A comprise an amorphous phase of the material. Therefore, two-sided layer deposition may be utilized in a furnace tool irrespective of a thickness delta between $T_b$ and $T_f$. As a result, in some embodiments a difference between $T_b$ and $T_f$ is greater than $\delta T$ (e.g., about 1,000 angstroms for a-Si).

In some embodiments, the one or more first layers 604 comprise gate layer comprising a first thickness which is less than about 1,000 angstroms. In some embodiments, a first back-surface amorphous material layer 606A comprises a dummy gate layer comprising a first thickness in a range from about 1,000 angstroms to about 2,000 angstroms. In some embodiments, a second back-surface amorphous material layer 608A comprises a planarization layer comprising a second thickness in a range from about 600 angstroms to about 700 angstroms. In some embodiments, a third back-surface amorphous material layer 610A comprises a memory layer for gate patterning comprising a third thickness in a range from about 200 angstroms to about 400 angstroms.

Figure 7:
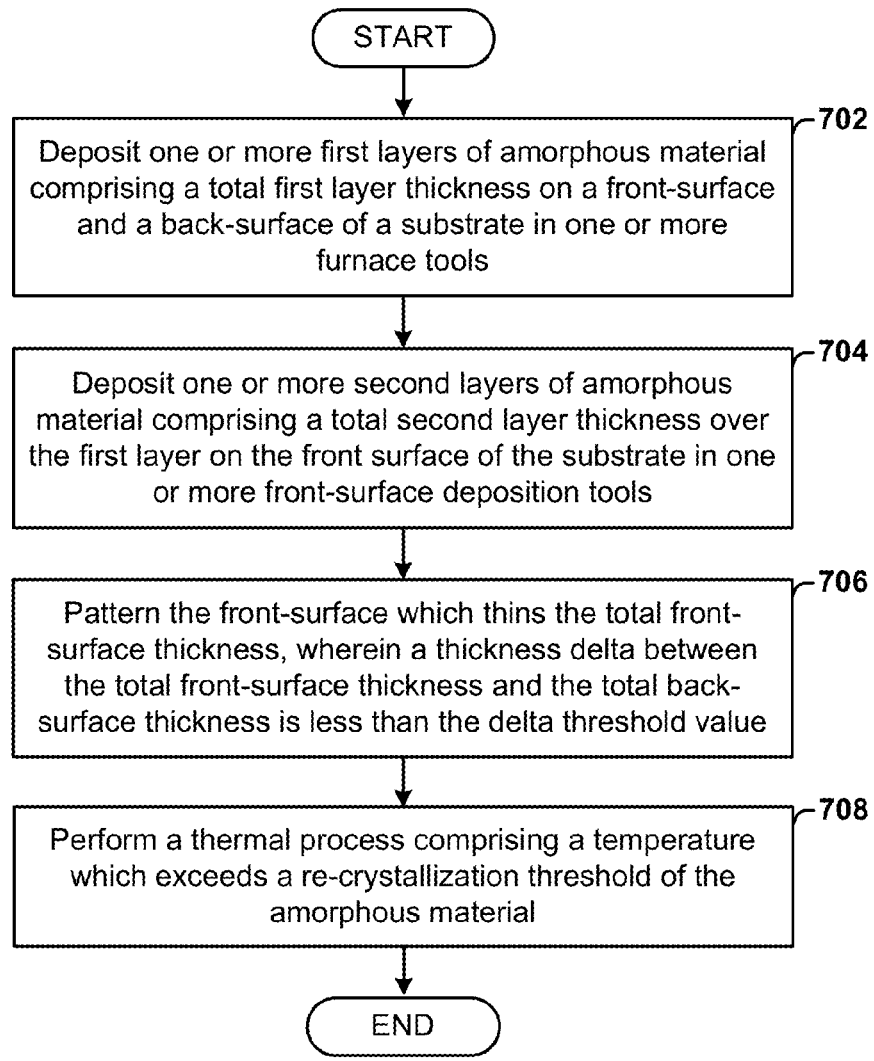
FIG. 7 illustrates some embodiments of a method of hybrid front-surface and two-sided layer deposition on a workpiece.

FIG. 7 illustrates some embodiments of a method 700 of hybrid front-surface and two-sided layer deposition on a workpiece.

At 702 one or more first layers of amorphous material comprising a total first layer thickness are deposited on a front-surface and a back-surface of a substrate in one or more furnace tools.

At 704 one or more second layers of amorphous material comprising a total second layer thickness are deposited over the first layer on the front-surface in one or more front-surface deposition tools, wherein a sum of the total first layer thickness and the second layer thickness comprise a total layer thickness.

At 706 lithographic patterning steps are performed on the front-surface which thins the total thickness of the one or more first or second layers on the front-surface such that a thickness delta between the total front-surface layer thickness and total back-surface layer thickness (i.e., the total thickness) is less than the delta threshold value. Above the delta threshold value, DOE methods have shown that the substrate will undergo significant warpage (e.g., greater than about 100 μm) if any downstream thermal process exposes the substrate to a temperature greater than a crystallization threshold of the amorphous material.

At 708 a thermal process comprising a temperature which exceeds a crystallization threshold of the amorphous material is performed.

Figure 8:
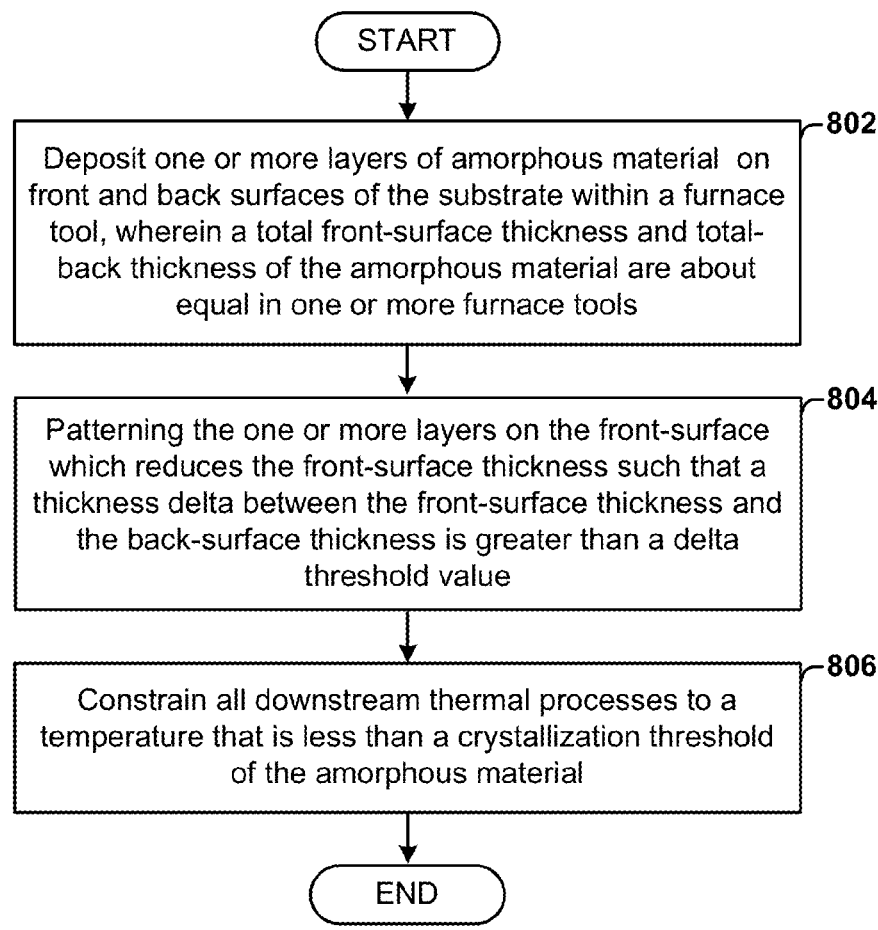
FIG. 8 illustrates some embodiments of a method of two-sided layer deposition on a workpiece under temperature constraints.

FIG. 8 illustrates some embodiments of a method 800 of two-sided layer deposition on a workpiece under temperature constraints.

At 802 one or more layers of amorphous material are deposited on front and back surfaces of a substrate within one or more furnace tools, wherein a total front-surface thickness and total-back thickness of the amorphous material are about equal.

At 804 patterning steps are performed on the one or more layers on the front-surface which reduces the front-surface thickness such that a thickness delta between the front-surface thickness and the back-surface thickness is greater than a delta threshold value which causes a predetermined amount of warpage to the substrate at a temperature above a crystallization threshold of the amorphous material, wherein the delta threshold value is determined by the aforementioned DOE methods.

At 806 all downstream thermal processes are constrained to a temperature that is less than a crystallization threshold of the amorphous material. In some embodiments, the thermal process comprises an anneal, layer deposition, or cure.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates a method to mitigate wafer warpage in advanced technology manufacturing processes due to crystallization of one or more amorphous layers with asymmetrical front-surface and back-surface layer thicknesses. After deposition of one or more layers of amorphous material on a front-surface and a back-surface of the wafer in a furnace tool, the front-surface layers are patterned which thins a front layer thickness. Downstream thermal processing performed at a temperature which exceeds a crystallization threshold of the amorphous material will result in asymmetric stress between the front and back surfaces due to the asymmetrical layer thicknesses. To mitigate this effect, the amount of warpage as a function of the difference in asymmetrical layer thickness may be determined such that a front-surface deposition tool may be utilized in conjunction with the furnace tool to reduce the difference in front-surface and back-surface layer thicknesses. Temperature constraints may also be utilized to prevent crystallization without constraining the difference in layer thickness. Both methods can be shown to limit the amount of wafer warpage below a predetermined threshold.

In some embodiments method of layer deposition on a substrate is disclosed. The method comprises depositing one or more first layers of amorphous material comprising a total first layer thickness on a front-surface and a back-surface of the substrate, and depositing one or more second layers of amorphous material comprising a total second layer thickness over the first layer on the front-surface. The method further comprises patterning the front-surface which thins the total thickness of the one or more first or second layers on the front-surface, and performing a thermal process comprising a temperature which exceeds a crystallization threshold of the amorphous material. A thickness delta between a total front-surface thickness of the patterned first or second layers remaining on the front-surface and total back-surface of the one or more first layers residing on the back surface is maintained at a value which is less than a delta threshold value which causes a predetermined amount of asymmetric stress between the front and back surface resulting in a predetermined warpage threshold of the substrate.

In some embodiments a method of epitaxial layer deposition on a substrate is disclosed. The method comprises depositing one or more layers of amorphous material on a front and back surfaces of a substrate within a furnace tool, wherein a total front-surface thickness and total-back thickness of the amorphous material are about equal. The method further comprises performing patterning steps on the one or more layers on the front-surface which reduces the front-surface thickness such that a thickness delta between the front-surface thickness and the back-surface thickness is greater than a delta threshold value which causes a predetermined amount of warpage to the substrate at a temperature above a crystallization threshold of the amorphous material. The method further comprises constraining all downstream thermal processes to a temperature that is less than a crystallization threshold of the amorphous material.

In some embodiments a device structure is disclosed. The device structure comprises a device disposed on a front-surface of a wafer and comprising one or more first layers. One or more second layers are disposed on a back-surface of the wafer and separated from one another by one or more dielectric layers. The one or more first layers and the one or more second layers comprise a same material, and the one or more first layers are formed simultaneously with a portion of the one or more second layers. In some embodiments, the one or more first layers and the one or more second layers comprise an amorphous phase of the material. In some embodiments, the one or more first layers and the one or more second layers comprise a crystalline of poly-crystalline phase of the material and exhibit in stress on the front-surface and back-surface of the wafer.

What is claimed is:

1. A method of layer deposition on a substrate, comprising:
depositing one or more first layers of amorphous material comprising a total first layer thickness on a front-surface and a back-surface of the substrate;
depositing one or more second layers of the amorphous material comprising a total second layer thickness over the first layer on the front-surface;
patterning the front-surface which thins a total thickness of the one or more first and second layers on the front-surface; and
performing a thermal process comprising a temperature which exceeds a crystallization threshold of the amorphous material;
wherein a thickness delta between a total front-surface thickness of the patterned first and second layers remaining on the front-surface and a total back-surface thickness of the one or more first layers residing on the back surface is maintained at a value which is less than a delta threshold value, which causes a predetermined amount of asymmetric stress between the front and back surfaces resulting in a predetermined warpage of the substrate.

2. The method of claim 1, wherein the delta threshold value and the predetermined warpage are determined by actions further comprising:
depositing one or more layers of the amorphous material on the front-surface and the back-surface of the substrate;
patterning the one or more layers on the front-surface which thins the total front-surface thickness;
heating the substrate to the temperature which exceeds the crystallization threshold; and
determining an amount of substrate warpage as a function of a difference between the total thickness and the total front-surface thickness.

3. The method of claim 1, wherein the one or more first layers of the amorphous material comprise amorphous silicon.

4. The method of claim 1, wherein the one or more first layers of the amorphous material are subject to patterning process for fin channel formation.

5. The method of claim 1, wherein the one or more second layers of the amorphous material comprise a dummy gate layer, a planarization layer, or a hard mask layer.

6. The method of claim 1, wherein the crystallization threshold is about 600° C.

7. The method of claim 1, where the thermal process comprises an anneal, layer deposition, or cure.

8. A method of epitaxial layer deposition on a substrate, comprising:
depositing one or more layers of amorphous material on front and back surfaces of the substrate within one or more furnace tools, wherein a front-surface thickness and a back-surface thickness of the amorphous material are about equal;
performing patterning steps on the one or more layers on the front-surface which reduces the front-surface thickness such that a thickness delta between the front-surface thickness and the back-surface thickness is greater than a delta threshold value which causes a predetermined amount of warpage to the substrate at a first temperature above a crystallization threshold of the amorphous material; and
constraining all downstream thermal processes to a second temperature that is less than the crystallization threshold of the amorphous material.

9. The method of claim 8, wherein the crystallization threshold is determined through actions comprising:
depositing the one or more layers of the amorphous material on the front-surface and the back-surface of the substrate with the furnace tool;
patterning the one or more layers which thins the front-surface thickness by the delta thickness value;
heating the substrate with a variable temperature; and
determining an amount of substrate warpage as a function of the variable temperature.

10. The method of claim 8, wherein the delta threshold value is determined by actions further comprising:
depositing the one or more layers of the amorphous material on the front-surface and the back-surface of the substrate;
patterning the one or more layers on the front-surface which thins the front-surface thickness;
heating the substrate to the temperature which exceeds the crystallization threshold; and
determining an amount of substrate warpage as a function of a difference between the the front-surface thickness and the back-surface thickness.

11. The method of claim 8, wherein the one or more layers of amorphous material comprise a source or drain definition layer, a dummy gate layer, a planarization layer, or a hard mask layer.

12. The method of claim 8, wherein the crystallization threshold is about 600° C.

13. The method of claim 8, wherein the thermal process comprises an anneal, layer deposition, or cure.

14. The method of claim 8, wherein the delta threshold value is less than about 1,000 angstroms.

15. A method, comprising:
depositing amorphous material on a front-surface and a back-surface of a substrate;
reducing a front-surface thickness of the amorphous material on the front-surface, so that the reduced front surface thickness of the amorphous material is less than a back-surface thickness of the amorphous material;
heating the substrate; and
measuring an amount of warpage of the substrate after heating the substrate.

16. The method of claim 15, wherein heating the substrate causes the amorphous material to phase transition into a crystalline phase.

17. The method of claim 15, further comprising:
depositing the amorphous material on front-surfaces and back-surfaces of a plurality of substrates;
reducing the front-surface thickness of the amorphous material by a variable amount across the plurality of substrates, so that the reduced front-surface thicknesses are different from one another for at least some of the plurality of substrates;
measuring the amount of warpage for at least some of the plurality of substrates; and
determining an amount of warpage as a function of a thickness delta between the front-surface thickness and the back-surface thickness for at least some of the plurality of substrates.

18. The method of claim 17, further comprising:
defining a maximum warpage of the substrate;
determining maximum thickness delta that results in the maximum warpage based upon the function; and
constraining a subsequent layer deposition and removal processes so that the thickness delta between the front-surface thickness and the back-surface thickness is less than the maximum thickness delta, so that a resultant warpage of the substrate is less than the maximum warpage.

19. The method of claim 15,
depositing the amorphous material on front-surfaces and back-surface of a plurality of substrates;
reducing the front-surface thickness of the amorphous material by about a same amount across the plurality of substrates;
heating at least some of the plurality of substrates to temperatures which are different from one another;
measuring the amount of warpage for at least some of the plurality of substrates; and
determining an amount of warpage as a function of temperature for at least some of the plurality of substrates.

20. The method of claim 19, further comprising:
defining a maximum warpage of the substrate;
determining a maximum temperature that results in the maximum warpage based upon the function; and
constraining a subsequent thermal process to a temperature that is less than the maximum temperature, so that a resultant warpage of the substrate is less than the maximum warpage.

* * * * *